Jan. 12, 1965 F. B. HUGLE 3,165,430

METHOD OF ULTRA-FINE SEMICONDUCTOR MANUFACTURE

Filed Jan. 21, 1963 2 Sheets-Sheet 1

INVENTOR.
FRANCES B. HUGLE
BY Harry R. Lubcke
AGENT

INVENTOR.
FRANCES B. HUGLE
BY Harry R. Lubcke
AGENT

United States Patent Office 3,165,430

Patented Jan. 12, 1965

3,165,430

METHOD OF ULTRA-FINE SEMICONDUCTOR MANUFACTURE

Frances B. Hugle, Santa Clara, Calif., assignor to Siliconix Incorporated, Sunnyvale, Calif., a corporation of California Filed Jan. 21, 1963, Ser. No. 252,941
10 Claims. (Cl. 148—187)

My invention relates to a method of manufacturing ultra-fine structures in semiconductor materials and particularly to the formation of narrow diffused semiconductor elements.

Important advances in the semiconductor and transistor arts have been concerned with the formation of smaller and smaller structures. This is particularly true of the gate element in the field effect transistor, a device also known as the unipolar transistor.

In this device, the "length" of the gate is ideally very small. The "length" is the dimension transverse to the major dimension of this electrode. The major dimension is termed the "width." These terms occur because the gate exerts a pinch effect upon the current flow between the source and the drain connections; which connections are made on opposite sides of the gate in the adjacent semiconductor material.

The art has employed photographic methods of manufacture, including coating the semi-conductor oxide with a photo-sensitive resist, placing over the resist a film having opaque and transparent parts according to the pattern desired, exposing the assembly to ultra-violet light, developing, and etching in hydrofluoric acid. This removes the oxide that was under the opaque parts of the film.

While this technique has been satisfactory for the usual electrode structures required in semiconductor manufacture, the limit of resolution with the photographic process has been of the order of 0.0005 inch.

In certain semiconductor devices the minimum dimension desired for particular electrodes is less than this amount. In the field effect transistor, for example, the length of the gate is inversely related to the gain, or $g_m$, of the device. Thus, if the minimum dimension obtainable in manufacture was 0.0001 inch instead of the 0.0005 inch of the photographic process, the $g_m$ of the transistor would be increased five times.

It is evident that the capacitance of the gate electrode to the adjacent electrodes would also be reduced by this precise method of manufacture. The quotient of $g_m$ to the capacitance of the gate forms a known expression for the figure of merit of a device of this kind. Having accomplished the precision mentioned, I have found that the capacitance is half that resulting from the known photographic method. Accordingly, the figure of merit of my new device is ten times, a whole order of magnitude, greater than that for a device manufactured by known methods.

I accomplish the precision mentioned by departing entirely from the photographic method in processing the device where minimum dimensions are required. A metal coating is employed to accomplish the resist function and this is mechanically scribed instead of being photographically exposed and developed.

An object of my invention is to provide a degree of precision in semiconductor manufacture which has heretofore been unobtainable.

Another object is to provide a method of semiconductor manufacture which requires fewer steps for forming an electrode, or element thereof, than has heretofore been required in the art.

Another object is to provide a tangible mechanical control over precise steps in the production of a semiconductor electrode.

Another object is to provide a simple and economical process in semiconductor manufacturing.

Other objects will become apparent upon reading the following detailed specification and upon examining the accompanying drawings, in which are set forth by way of illustration and example certain embodiments of my invention.

Figure 9:
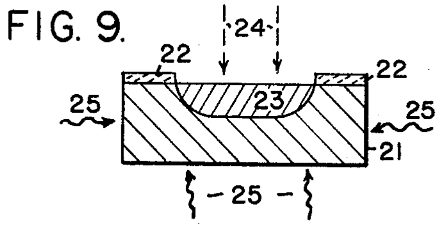
Figure 10:
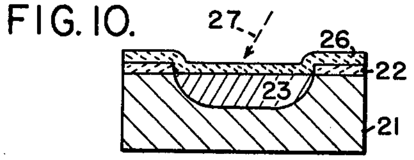
Figure 11:
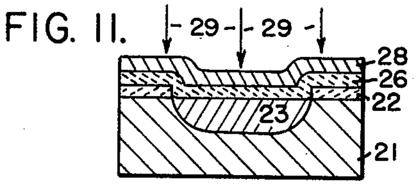
Figure 12:
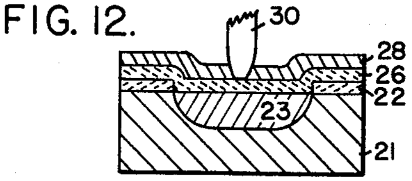
Figure 13:
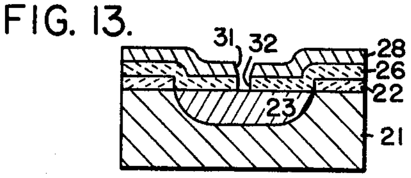
Figure 14:
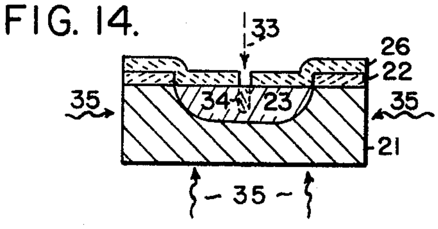
Figure 15:
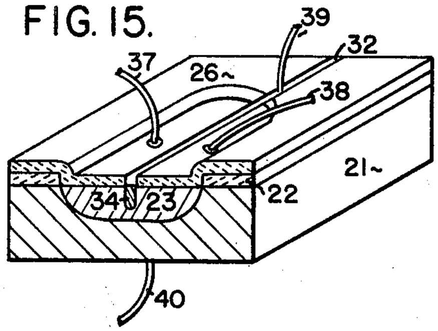
Figure 16:
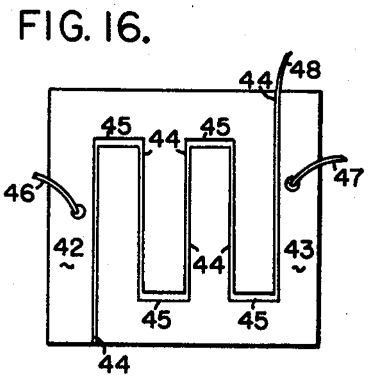

FIG. 9 shows the initial state of a field effect transistor device following channel diffusion, FIG. 10 shows the same after reoxidation, FIG. 11 shows a deposition of metal step of the same, FIG. 12 shows the scribing step of the same, FIG. 13 shows the etching step of the same, FIG. 14 shows the diffusion step of the same, FIG. 15 shows a perspective view of the completed field effect transistor, and FIG. 16 shows a plan view of an alternate form of field effect transistor.

Figure 1:
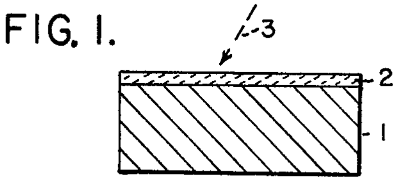
FIG. 1 is a sectional view of a piece of semiconductor with an oxide coating.

In FIG. 1 numeral 1 indicates a piece of semiconductor material; silicon for the purpose of this explanation. This is shown as a section of a wafer, although a full wafer with a multiple of such pieces may be processed and the individual pieces separated later. A silicon oxide coating 2 is formed upon the upper surface of the semiconductor material by exposing the same to steam, indicated by dotted and inclined arrow 3 in the presence of oxygen at elevated temperature of the whole. Other equivalent methods of obtaining the oxide may be employed, as may similar nitriding processes employing nitrogen to give silicon nitride. The requirement for coating 2 is that it be refractory at semiconductor diffusion temperatures and that it be etchable.

Figure 2:
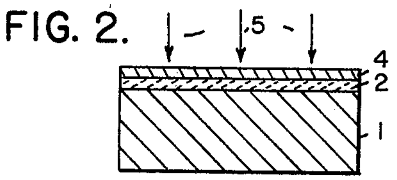
FIG. 2 is the same undergoing metal deposition.

In FIG. 2 a coating 4 of a metal is being deposited en vacuo as indicated by arrows 5. This is deposited over the previously deposited oxide layer 2. I have found that aluminum is a suitable metallic element for the coating 4.

The aluminum is vaporized by an electrically heated filament disposed within the vacuum enclosure. I prefer to place the semi-conductors 1 at a distance of approximately 15 cm. from the filament and usually below the filament and to flash this element at a vacuum of approximately $10^{-6}$ mm. of mercury. The semiconductor material is maintained at substantially room temperature during this processing step. The coating obtained is thin, of the order of one micron thickness, and presents a metallic appearance.

The aluminum coating provides the correct substance for scribing a very fine line or "trench" therein according to my invention. Known photo-resists and special waxes have been found unsatisfactory in this regard although careful initial work according to the best known techniques employed these substances.

Figure 3:
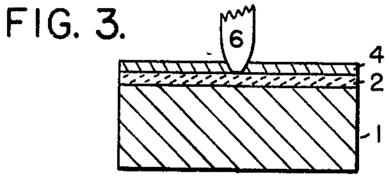
FIG. 3 is the same showing the mechanical scribing process.

FIG. 3 illustrates the scribing step. A "clamshell" type of diamond stylus 6 is preferably employed for manufacturing. It is possible to employ steel for the scribe; in fact, to employ a new razor blade, but the diamond gives consistent dimension and character to the lines formed throughout hundreds of manufacturing operations. This is not so with steel because of wear.

Figure 4:
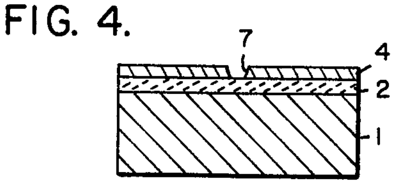
FIG. 4 is the same showing the resulting "trench,"

With a translatory motion, as up from the surface of the paper in the drawing, a trench 7 is formed as shown in FIG. 4.

A light pressure is employed upon stylus 6 in the scribing process. This pressure is of the order of a few grams. It is important that the oxide coating 2 should not be fractured in scribing. This can easily be avoided with light pressure upon the stylus. A commercially available K&S wafer scribing machine can be modified for the reduced pressure and may be employed to hold the semiconductor wafer or piece and to translate the diamond scribe.

The bottom of trench 7 exposes the oxide surface and has a dimension transverse to the direction of scribing of a selected value normally within the range of 1½ to 2½ microns, and may be of the same order as the thickness of the aluminum coating layer.

Figure 5:
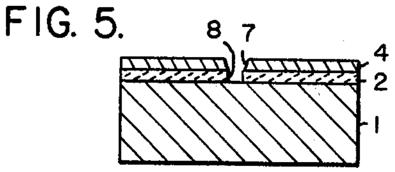
FIG. 5 is the same showing the oxide etched away under the trench.

In FIG. 5 etching the oxide layer 2 beneath the trench in the metal layer 4 has been accomplished. This is carried out by immersing the whole piece in a mild etch, such as dilute hydrofluoric acid. When this is done it will be noted that the aluminum layer 4 bubbles considerably initially, indicating that it is being consumed, but an apparent oxidation takes place after a short time; the aluminum becoming passivated and thus resistant to the etch. The silicon oxide layer 2, however, is etched away by the hydrofluoric acid and a continuation of the bottom of the trench down to the semiconductor material 1 is obtained, as shown at 8 in FIG. 5.

Figure 6:
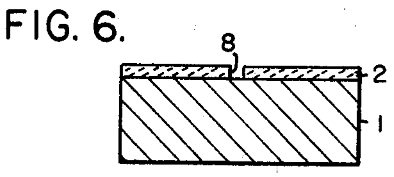
FIG. 6 is the same showing the metal deposit removed.

FIG. 6 illustrates the next step, in which the aluminum metallic layer 4 has been removed. This is accomplished by immersing the work piece in sodium hydroxide, or an equivalent etchant, including hydrochloric acid, which attacks the metal but not the oxide nor the semiconductor.

Figure 7:
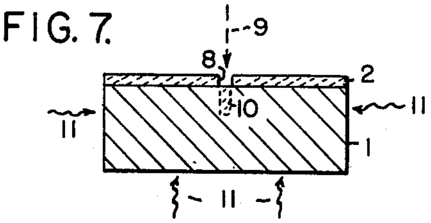
FIG. 7 is the same showing the diffusion process.

FIG. 7 shows the diffusion of a selected impurity through trench etch 8, such as a group III vapor, say boron, as represented by dotted arrow 9, into the semiconductor material 1. The semiconductor material 1 being N silicon in this example, P silicon is formed directly below the trench etch 8 as shown dotted at 10. This processing is accomplished in a furnace known to the art, which is maintained at a temperature within the range of 900 to 1,300° C. The heat incident upon the work is indicated by the presence of the wavy arrows 11. The penetration of the diffusion conversion 10 extends to a depth of a few microns.

Figure 8:
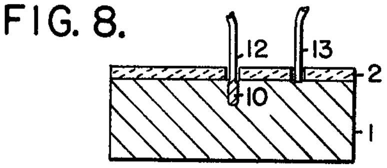
FIG. 8 shows the completed illustrative semiconductor device.

In FIG. 8 the completed article of manufacture is shown. The basic device is the same as at the completion of the processing according to FIG. 7. In addition, an ohmic contact has been established for external lead 12 to contact elemental electrode 10 and a window has been cut through oxide 2 and a similar connection has been established by means of external lead 13 to semiconductor 1. The window is cut by the known photo-resist technique. The ohmic contacts may be established by plating gold upon the silicon and alloying the leads thereto by elevating the temperature to 400° C. In this illustrative manufacturing process the device that has been made is a two element diode, one element or electrode of which is very narrow according to the teaching of this invention.

The steps illustrated in FIGS. 1 through 8 set forth the essential processing according to my ultra-fine technique. This processing may be employed for other semiconductor structures, as will now be considered.

FIGS. 9 through 15 illustrate the process steps for a field effect, or unipolar, transistor according to this invention.

FIG. 9 shows a semiconductor body, for example, N silicon, which is indicated by numeral 21. A mask of a refractory material, such as silicon oxide, has been formed by previous application of known photo-resist techniques disclosed in the introductory paragraphs of this specification. This is to restrict the extent of the present processing to only the central area, or channel, shown.

The formation of the opposite type of silicon, the P type, by the diffusion process is illustrated in FIG. 9 at 23. A vapor of one of the group III elements, say boron, is introduced as shown by dotted arrows 24 while the work is heated to a known temperature as indicated by the presence of wavy arrows 25.

FIGS. 10 through 15 follow the general processing steps previously outlined in connection with FIGS. 1 through 8.

In FIG. 10 a second silicon oxide or equivalent substance is grown or deposited in layer 26, which layer extends over the whole top of the work. The exposure to steam in the presence of oxygen at an elevated temperature is indicated by dotted inclined arrow 27 to accomplish this step.

In FIG. 11 the vacuum evaporation of the metal layer, as aluminum, 28 is shown by arrows 29 indicating the deposition. The process is the same as disclosed in connection with FIG. 2.

In FIG. 12 the scribing step is illustrated, with clamshell scribe 30 employed to produce a trench in the aluminum coating 28 without fracturing or otherwise altering the oxide coating of layer 26 lying beneath.

In FIG. 13 the trench 31 resulting from the scribing step is shown as well as the continuation thereof down through oxide coating 26 by etching to produce the elongated aperture 32. These aspects of the manufacture are the same as set forth in connection with previous FIGS. 4 and 5.

In FIG. 14 a second diffusion process is accomplished. The vapor of a group V element of the Periodic Table, such as phosphorus, is indicated by dotted arrow 33 as diffusing through the trench and forming an N silicon gate electrode 34 beneath the same in the otherwise P silicon 23. This is carried out at an elevated temperature of the order of 1,000° C. in a known furnace.

It will be noted that the aluminum metallic layer 28 of FIG. 13 is absent in FIG. 14. It has been removed prior to the diffusion heating by sodium hydroxide, or an equivalent, or an equivalent etchant, as was previously described in connection with FIG. 6.

The completed field effect transistor is shown in perspective in FIG. 15. The front surface is shown in section and at the same scale as in previous FIGS. 9 through 14.

The initial oxide deposit 22 is seen to extend in an arc at the rear of the structure, thus limited, it restricts the formation of the P silicon to the central part of the wafer piece. In FIG. 15 layer 22 is overlaid by subsequent layer 26, but the latter takes the contour of the former. The continuation of trench 32 in oxide layer 26 extends to the rear of the wafer piece structure, thus N gate electrode 34 extends into the base N silicon at the rear. This is required in this type transistor, at least to provide a reasonable junction of the N materials. In my scribing technique the trench is carried all the way to the rear of the wafer for simplicity of scribing in manufacture.

External lead 37 is the source connection for this type of transistor. A window is formed in the left-hand side of oxide layer 26 through to the P silicon 23 by the further application of known photo-resist techniques. The ohmic contact to the P silicon is established by plating with gold or aluminum and alloying the lead 37 thereto, as has been previously described. At the same time that these processes are carried out for lead 37 they are carried out for drain lead 38, which lead connects to the P silicon to the right of gate 34. A lead 39 is also connected to gate 34 at the rear, through trench 32; or, additionally or alternately, a bottom contact 40 is made to body 21.

It will be understood that the transistor of FIG. 15 may have variations of dimensions over a relatively large range and still be manufactured according to this invention. However, for sake of illustration, the dimensions for an embodiment are here given.

The length of the gate 34, being the distance from left to right across the section at the front of FIG. 15, is the ultra-fine structure; i.e., of the order of 0.0001 inch, say in the range of from 1½ to 2½ microns. The vertical separation between the two N silicons 21 and 34, which forms the gate proper in the P silicon 23 is of the order of ⅓ to 1 micron. The depth of the diffused gate 34, being the vertical dimension thereof in the section of FIG. 15, is of the order of 1 to 3 microns. The width of this gate is the front to back dimension of this element and this may be within the range of from 0.004 to 0.100 inch. The left to right dimension of the P silicon 23 as noted on the front section in FIG. 15 is of the order of 0.004 inch.

FIG. 16 shows a plan view of a field effect transistor of the same type vertically detailed in FIG. 15, but which has a considerably greater width of gate. It will be recalled that the "width" of the gate 34 in FIG. 15 is its longest dimension; from front to back in FIG. 15. By making this dimension progress back and forth over the wafer piece 21 this dimension can be considerably increased. In FIG. 16 this dimension is approximately five times that in FIG. 15. This modification results in greater-power-handling capability for the transistor.

The five segments of the gate 44 that run vertically of the paper in FIG. 16 are formed by scribing according to this invention, as was gate 34 in FIGS. 12 through 15. These are narrow and thus contribute to the improved transistor characteristic previously set forth. In order that these be connected together to form a single continuous gate element, short broader segments 45 are included at four places.

Following the teaching of all prior fifteen figures the scribed parts of the gate 44 are processed. After the aluminum layer has been removed, as shown in FIG. 6, the work is coated with a known photo-resist and the four segments of the gate 45 are formed by providing a film having opaque parts corresponding to the segments 45. The photo-resist is exposed through this film and then is developed. This removes the resist at the places of segments 45 and by an etch such as hydrofluoric acid the over-layer of oxide corresponding to layer 26 in FIG. 14 is removed down to the P silicon.

From these two processes, scribing and photo-resist, a continuous path has now been provided for the full extent of the gate, this being the "width" thereof. The diffusion process of FIG. 14 is then accomplished to provide a continuous N silicon gate.

As taught in connection with FIG. 15, windows for ohmic connections are etched by photo-resist methods in FIG. 16. Lead 46 is thus provided for establishing contact with all of the source P silicon and lead 47 for establishing contact with all of the drain P silicon. Lead 48 is also provided to make contact with the gate 44–45 per se.

The purpose of providing the dual processing for forming the gate in FIG. 16 as above described was to retain the scribing process on a simple linear basis. It will be understood that with two-dimensional control of a scribe that a continuous line consisting essentially of segments 44 and 45 may be scribed.

In FIG. 16 the segments 45 have a greater thickness ("longer" in terms of gate technology) than do segments 44 because the limit of resolution of the order of 0.0005 inch for the photographic process does not allow these to be as narrow as the scribed segments 44, which are processed according to this invention.

While specific examples have been presented to most easily teach my invention, it will be understood that numerous departures in materials and details of processing may be taken without departing from it.

Instead of silicon, the semiconductor material may be germanium, or the "III–V compounds." Among the latter are indium antimonide, gallium arsenide and gallium phosphide.

Instead of aluminum for the scribing medium, another material that is both soft enough to be scribed without damaging the oxide or other refractory mask and inert enough to protect it against the etchant may be used. Such materials include the soft form of evaporated rhodium, or platinum.

The sections that have been shown as vertical in FIGS. 1 through 15 have an expanded vertical scale, as is common in representing this art. In order to obtain clarity, a "vertical" section is usually taken at 5° from the horizontal so that the construction of the otherwise very flat transistor may easily be seen.

Various other modifications may be made in the arrangement, size, proportions and shapes of the illustrative embodiments shown without departing from the scope of my invention as defined by the following claims.

Having thus fully described my invention and the manner in which it is to be practiced, I claim:

1. The method of making semiconductor devices which comprises the steps of;
(a) providing an etchable refractory coating upon a surface of a semiconductor material having a given conductivity type,
(b) depositing a thin layer of a shoft etchant-resistant metal upon said coating,
(c) scribing a trench through said metal, but not through said coating, the width of said trench being narrow with respect to the length of said trench upon said coating,
(d) etching away said coating exclusively under said trench down to said semiconductor material,
(e) dissolving away said metal from said coating with an etchant reactive with said metal, and
(f) diffusing a conductivity-determining impurity into said semiconductor material through the trench etched in said coating.

2. The method of making semiconductor devices as in claim 1 in which
said metal is selected from the group consisting of aluminum, rhodium and platinum.

3. The method of making semiconductor devices as in claim 1 in which
said metal is deposited upon said coating while said coating is at substantially room temperature.

4. The method of making semiconductor devices as in claim 1 in which
a stylus is traversed upon said metal to form said trench through said metal without fracturing said refractory coating.

5. The method of making semiconductor devices as in claim 1 in which
said etchant-resistant metal is deposited to a thickness of the order of one micron upon said coating and the width of said trench is of the same order as the thickness of said metal layer.

6. The method of manufacturing a semiconductor field effect transistor which comprises the steps of;
(a) diffusing a first conductivity type determining impurity into a limited area of a surface of a semiconductor material of given conductivity type to change the conductivity type thereof,
(b) providing an adherent etchable refractory coating upon the whole area of said surface,
(c) depositing a thin layer of soft etchant-resistant metal upon said coating,
(d) scribing a trench through said metal but not through said coating, the width of said trench being narrow with respect to the length of the said trench upon said coating, and said trench extending over said limited area and in part over the area adjacent thereto upon said semiconductor material,
(e) etching away said coating exclusively under said trench down to said semiconductor material, thereby exposing said semiconductor material, (*f*) dissolving away said metal from said coating with an etchant reactive with said metal, and (*g*) diffusing a second conductivity type determining impurity of conductivity type opposite to said first conductivity type into said exposed semiconductor material to change the conductivity type of said exposed semiconductor material within said limited area.

7. The method of manufacturing a semiconductor field effect transistor as in claim 6 in which said metal is selected from the group consisting of aluminum, rhodium and platinum.

8. The method of manufacturing a transistor as in claim 6 in which two ohmic connections are attached to said limited area, one on each side of said trench, and an additional ohmic connection is attached to said semiconductor material outside of said limited area.

9. The method of manufacturing a semiconductor field effect transistor as in claim 6 in which said etchant-resistant metal is deposited to a thickness of the order of one micron upon said coating and the width of said trench is of the same order as the thickness of said metal layer.

10. The method of manufacture of semiconductor devices which includes the steps of;

(*a*) diffusing a first conductivity type determining impurity into a limited area of a surface of a semiconductor material of given conductivity type to change the conductivity type thereof, (*b*) forming an adherent etchable refractory coating upon the whole area of said surface, (*c*) depositing a thin layer of soft etchant-resistant metal upon said coating, (*d*) scribing plural trenches, spaced approximately parallel one from the other, each said trench having opposite ends, through said metal but not through said coating, the width of each trench being narrow with respect to the length of said trench upon said coating, and each trench extending over said limited area and at least in part over the area adjacent thereto upon said semiconductor material, (*e*) etching away said coating exclusively under said trench down to said semiconductor material to expose said semiconductor material, (*f*) dissolving away said metal from said coating with an etchant to expose said coating, (*g*) applying a photo-resist over the said exposed semiconductor material and said exposed coating, (*h*) providing a mask over said photo-resist having opaque line segments over said coating joining said trenches at successive said opposite ends, (*i*) exposing said photo-resist, (*j*) developing said photo-resist, (*k*) etching the masked line segments of said coating to form a continuous trench, and (*l*) diffusing a second impurity of conductivity type opposite to said first conductivity type into said limited area only under said continuous trench to again change the conductivity type of the semiconductor material under said continuous trench.

References Cited by the Examiner

UNITED STATES PATENTS

| | | | |
|---|---|---|---|
| 2,332,003 | 10/43 | New | 156—12 |
| 2,967,985 | 1/61 | Shockley | 148—33.2 |
| 2,995,473 | 8/61 | Levi | 156—17 |
| 3,006,789 | 10/61 | Nijland | 148—33.2 |
| 3,028,655 | 4/62 | Dacey | 148—33.2 |
| 3,041,213 | 6/62 | Anderson | 148—33.2 |
| 3,046,176 | 8/62 | Bosenberg | 156—17 |
| 3,054,709 | 9/62 | Freestone | 156—17 |
| 3,083,441 | 4/63 | Little | 148—33.2 |

OTHER REFERENCES

Aschner et al.: Journal of the Electrochemical Society, May 1959, pages 415–417.

BENJAMIN HENKIN, *Primary Examiner.*

DAVID L. RECK, *Examiner.*